US 6,697,389 B2

(12) United States Patent
Funakawa et al.

(10) Patent No.: US 6,697,389 B2
(45) Date of Patent: Feb. 24, 2004

(54) TUNABLE LASER SOURCE DEVICE

(75) Inventors: Seiji Funakawa, Tokyo (JP); Nobuaki Ema, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 48 days.

(21) Appl. No.: 10/171,126

(22) Filed: Jun. 13, 2002

(65) Prior Publication Data

US 2002/0196818 A1 Dec. 26, 2002

(30) Foreign Application Priority Data

Jun. 14, 2001 (JP) .................................. P. 2001-179460

(51) Int. Cl.[7] ................................................ H01S 3/10
(52) U.S. Cl. ...................................................... 372/20
(58) Field of Search ............................. 372/20, 20.02, 372/32

(56) References Cited

U.S. PATENT DOCUMENTS

| 6,594,289 B2 | * | 7/2003 | Yamada et al. ............... 372/20 |
| 6,614,511 B1 | * | 9/2003 | Sakairi et al. ............. 356/73.1 |
| 2002/0191652 A1 | * | 12/2002 | Ema ........................... 372/20 |
| 2002/0196818 A1 | * | 12/2002 | Funakawa et al. ............ 372/20 |

* cited by examiner

*Primary Examiner*—Leon Scott, Jr.
(74) *Attorney, Agent, or Firm*—Fish & Richardson P.C.

(57) ABSTRACT

In a tunable laser source device for branching a light output from a tunable laser source portion 1 to supply to a wavelength measuring device 6 and a wavelength calibrating reference device 5 and then controlling the tunable laser source portion in response to an output of the wavelength measuring device, at least one peak and one notch or two peaks or two notches or more in a measurement interference period of the wavelength measuring device are included between a plurality of reference wavelengths of the wavelength calibrating reference device.

5 Claims, 5 Drawing Sheets

TUNABLE LASER SOURCE DEVICE

BACKGROUND OF THE INVENTION

The present invention relates to a tunable laser source device employed in evaluating or manufacturing the optical communication system or device.

A configuration of the tunable laser source device in the prior art will be explained with reference to FIG. 4 hereunder.

In FIG. 4, the light emitted from the tunable laser source portion 11 is output to the outside of the tunable laser source device via the optical coupler 18a as the optical output.

Further, the light branched by the optical coupler 18a is branched by the optical coupler 18b. One branched output is fed to the wavelength measuring device 16 that measures the wavelength by utilizing the periodical change of the interference power generated based on the deviation between optical path lengths in the etalon, etc. The other branched output is fed to the gas cell as a reference for callibrating wavelength 15 and the wavelength measuring device 16.

Further, detected outputs of the gas cell as a reference for callibrating wavelength 15 and the wavelength measuring device 16 are converted into electric signals and then fed to the control circuit 14 that is constructed by CPU.

Further, the control circuit 14 controls the wavelength of the light, that is output from the tunable laser source portion 11 via the motor driving circuit 12 and the LD current driving circuit 13, in response to the set signal from the user interface portion 17.

Next, the details of the tunable laser source portion 11 will be explained with reference to FIG. 3 hereunder.

FIG. 3 is a view showing a detailed configuration of the tunable laser source portion 11. This configuration includes the semiconductor laser (LD) 21, the lenses 22a, 22b, the diffraction grating 23, the mirror 24, and the motor 25.

The light emitted from the semiconductor laser 21 is shaped into the parallel light by the lens 22a and then enters into the diffraction grating 23.

Only the light having the wavelength, which is decided by the positional relationship between the diffraction grating 23 and the mirror 24, out of the light incident into the diffraction grating 23 can be fed back to the semiconductor laser 21 once again. As a result, the light having the particular wavelength is output from the semiconductor laser 21 via the lens 22b.

If the external cavity length is changed by driving the motor 25 to rotationally move the position of the mirror 24 around the center O of rotation, the wavelength of this output light can be changed.

In this case, if the motor 25 is set simply to a predetermined position, sometimes the infinitesimal error is generated in the position of this mirror 24. Therefore, as shown in FIG. 4, the detected output of the wavelength measuring device 16 is fed back to the control circuit 14 such that the control is carried out by driving the motor 25 to mate always the measured wavelength with the predetermined wavelength.

Further, the wavelength of the light generated by the semiconductor laser can be controlled by adjusting the driving current of the semiconductor laser. Therefore, the wavelength of the light can be controlled by feeding back the detected output of the wavelength measuring device to the driving circuit of the semiconductor laser.

As described above, the wavelength measuring device that measures the wavelength by utilizing the periodical change of the interference power based on the deviation between optical path lengths in the etalon, etc. is employed as the wavelength measuring device in the tunable laser source device in FIG. 4. Therefore, in order to compensate the change in the deviation between the optical path lengths due to the change of the ambient temperature, the temperature controlling device for maintaining the wavelength measuring device at the constant temperature (temperature control) is provided.

Further, the gas cell as a reference for callibrating wavelength 15 is provided to the tunable laser source device in FIG. 4 and is used to calibrate the wavelength measuring device.

In this case, the gas cell as a reference for callibrating wavelength 15 in FIG. 4 looks for the wavelength at one point from already-known absorbed line wavelengths as the reference wavelength.

This already-known wavelength is set as the reference wavelength of the wavelength measuring device 16 in which, as shown in FIG. 5, the periodical change of the interference power is present.

As shown in FIG. 5, the wavelength linearity correction table by which the output of the wavelength measuring device 16 in which the periodical change of the interference power is present is corrected on the basis of the reference wavelength is formulated, and then is stored in a memory means (not shown) in the control circuit 14.

As shown in FIG. 5, the gas cell 15 has the characteristic to absorb the wavelength at the particular already-known one point. The absorbed line wavelengths of the gas cell are very stable to the environmental change such as the change of the ambient temperature, and others.

In contrast, as shown in FIG. 5, the measured output of the wavelength measuring device 16 that utilizes the deviation between the optical path lengths changes to have peaks and notches of the power periodically.

However, the interval between the peak (notch) and the peak (notch) has the characteristic that depends on the change of the ambient temperature.

More particularly, as shown in FIG. 5, even though the wavelength linearity correction table is formulated at a certain ambient temperature while employing the absorbed line wavelength, that is indicated by an arrow, of the gas cell as a reference for callibrating wavelength 15 as the reference value of the measured output of the wavelength measuring device 16, such measured output of the wavelength measuring device 16 in FIG. 5 is expanded and contracted in the lateral axis direction if the ambient temperature is changed. As a result, the error is generated in the wavelength linearity correction table.

Accordingly, there exists the following problem in the tunable laser source device set forth in FIG. 4 in the prior art.

Although the temperature control is applied to the wavelength measuring device, the infinitesimal temperature change is caused in the device if the ambient temperature of the device in formulating the wavelength linearity correction table at the time when the device is carried out of the factory is different from that of the device in user's employment. For this reason, such temperature change exerts not a little effect upon the wavelength measuring accuracy.

In order to maintain the wavelength accuracy obtained at the time when the device is carried out of the factory against the variation in the atmospheric temperature, the wavelength measuring device must be installed into the high performance temperature controlling mechanism (thermostatic bath). Normally, these high performance thermostatic baths are large in size and high in cost.

SUMMARY OF THE INVENTION

It is an object of the present invention to overcome the problems of the tunable laser source device set forth in FIG. 4 in the prior art, more particularly the problem such that, when an ambient temperature of the device in user's employment becomes different from that of the device in preparing a wavelength linearity correction table at the time when the device is carried out of a factory, a minute temperature change is caused in the device to have not a little effect on a wavelength measuring accuracy.

In order to overcome the above subjects, there is provided a tunable laser source device for branching a light output from a tunable laser source portion to supply to a wavelength measuring device and a wavelength calibrating reference device and then controlling the tunable laser source portion in response to an output of the wavelength measuring device, wherein at least one peak and one notch or two peaks or two notches or more in a measurement interference period of the wavelength measuring device are included between a plurality of reference wavelengths of the wavelength calibrating reference device. (Aspect 1)

According to this, since at least two points, i.e., one peak and one notch in the measurement interference period of the wavelength measuring device can be calibrated by the wavelength calibrating reference device, the precise wavelength measurement can be achieved even if the external environment is changed.

Further, the wavelength calibrating reference device is formed of a gas cell. (Aspect 2)

Further, the wavelength measuring device measures the wavelength by utilizing the periodical change of the interference power based on the deviation between optical path lengths. (Aspect 3)

Further, the wavelength measuring device can be formed of an etalon. (Aspect 4)

Further, if the tunable laser source portion is constructed such that it can sweep continuously a wavelength thereof, the effect of improving the wavelength accuracy in the continuous wavelength sweep can be increased. (Aspect 5)

These tunable laser source devices that are capable of sweeping the wavelength continuously with high accuracy can contribute the event that the accuracy in the measurement of the wavelength dependency characteristic of optical parts employed in the optical communication, etc. is increased considerably.

DETAILED DESCRIPTION OF THE PREFERRED EMBODIMENTS

A configuration of a tunable laser source device of the present invention will be explained with reference to FIG. 1 hereunder.

Figure 1:
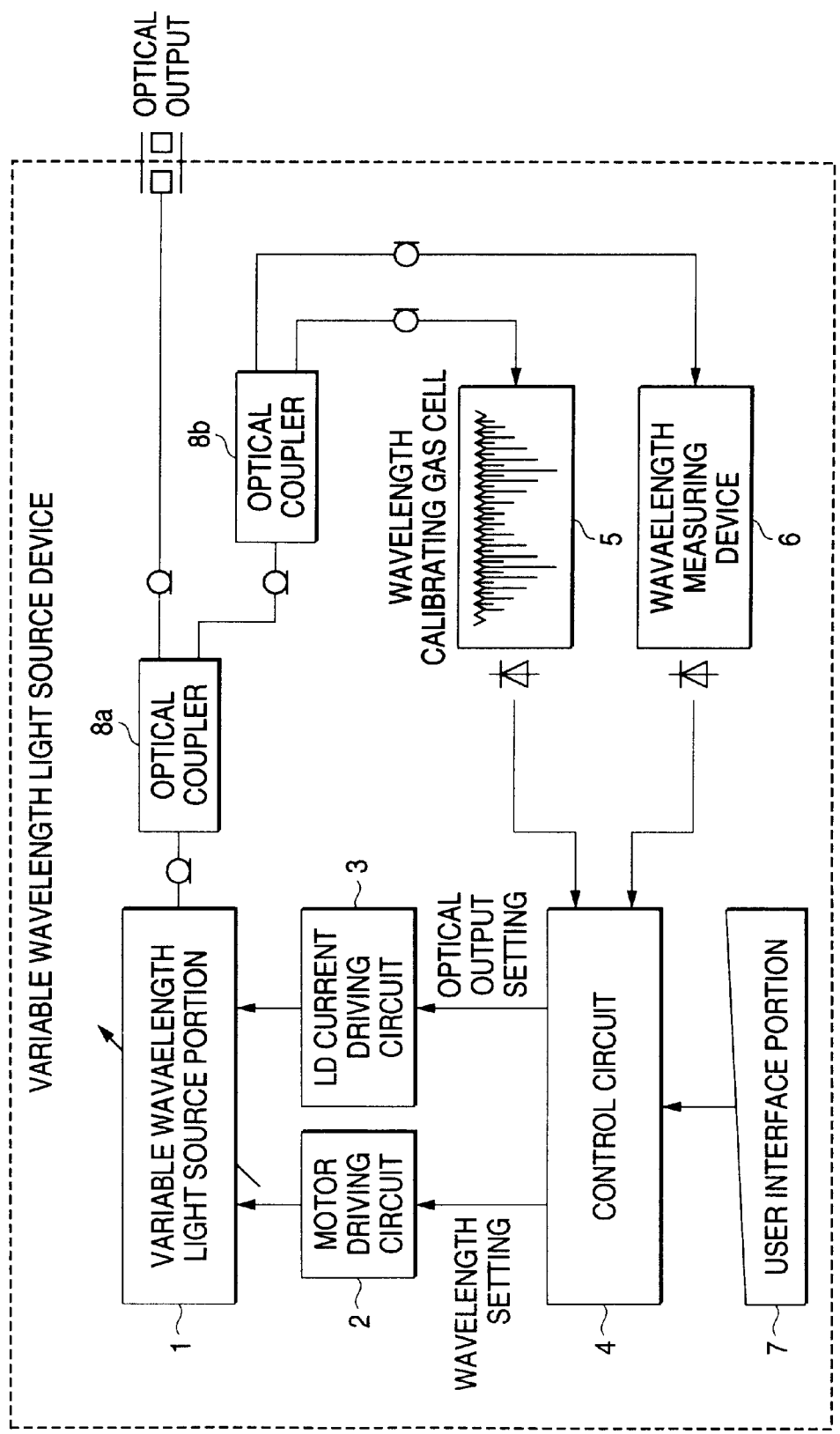
FIG. 1 is a view showing a configuration of the tunable laser source device of the present invention.

In FIG. 1, a light emitted from a tunable laser source portion 1 is output to the outside of the tunable laser source device via an optical coupler 8a as an optical output.

Further, the light branched by the optical coupler 8a is branched by an optical coupler 18b. One branched output is supplied to a wavelength measuring device 6 that measures the wavelength by utilizing the periodical change of the interference power generated based on the deviation between the optical path lengths in the etalon, etc. The other branched output is supplied to a gas cell as a reference for callibrating wavelength 5 and a wavelength measuring device 6.

Further, detected outputs of the gas cell as a reference for callibrating wavelength 5 and the wavelength measuring device 6 are converted into electric signals and then supplied to a control circuit 4 that is constructed by CPU.

Further, the control circuit 4 controls the wavelength of the light, that is output from the tunable laser source portion 1 via a motor driving circuit 2 and an LD current driving circuit 3, in response to a set signal from a user interface portion 7.

Figure 3:
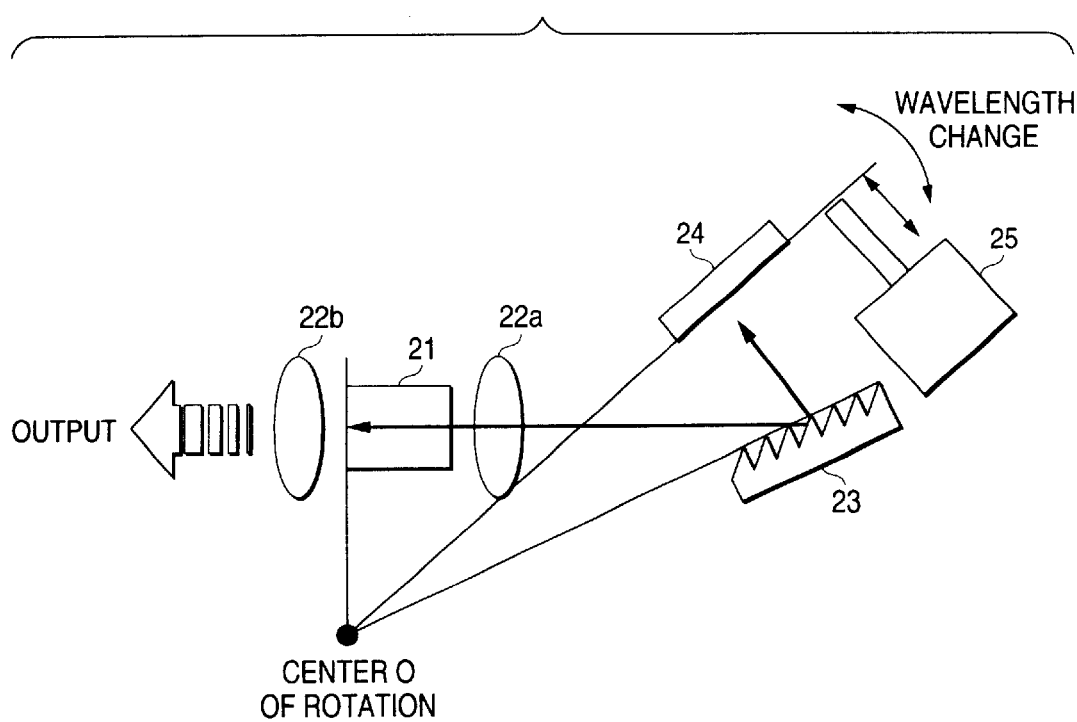
FIG. 3 is a view showing a configuration of a tunable laser source portion.
Figure 4:
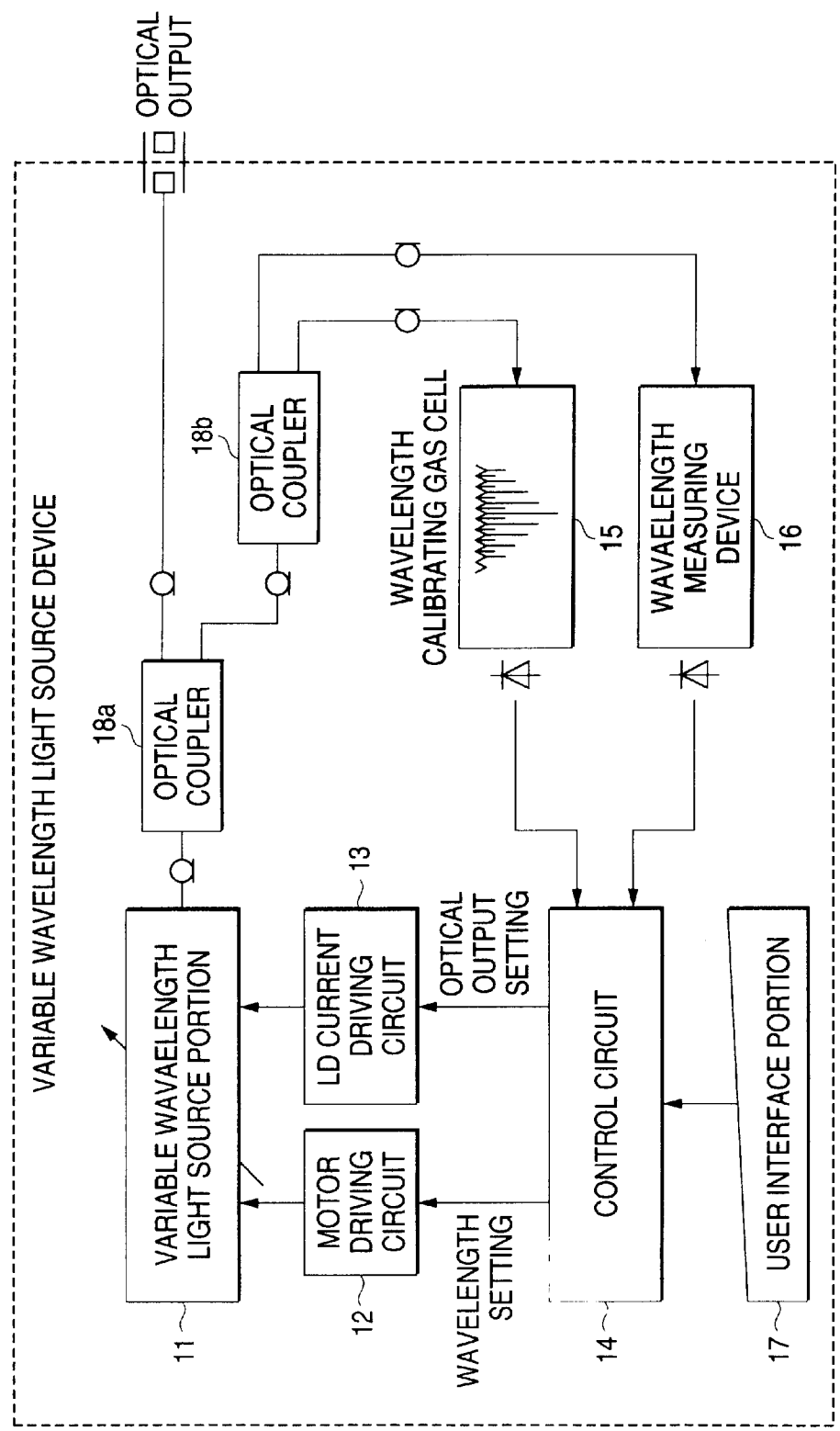
FIG. 4 is a view showing a configuration of the tunable laser source device in the prior art.
Figure 5:
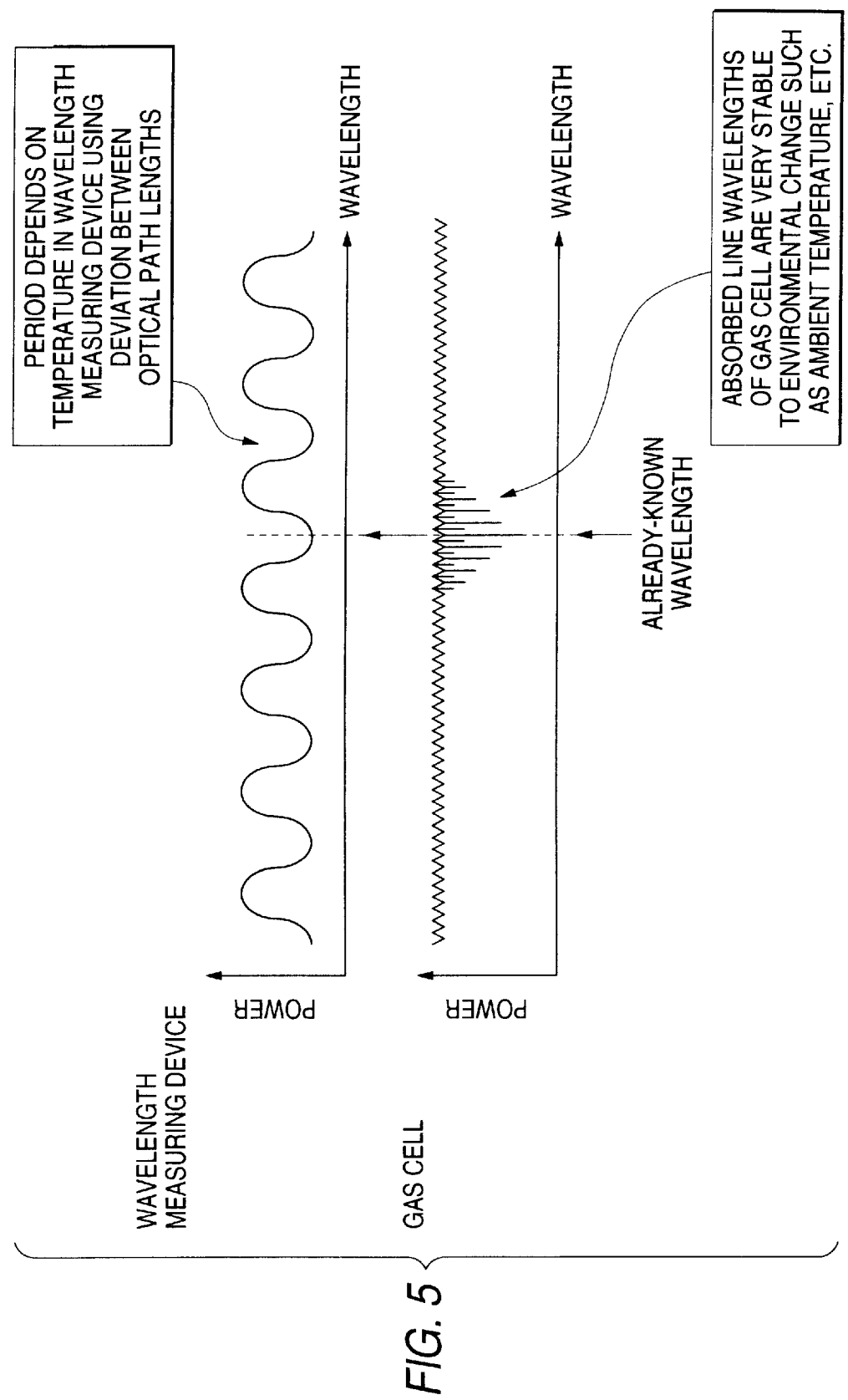
FIG. 5 is a view showing a relationship of outputs between the wavelength measuring device and the gas cell as a reference for callibrating wavelength in the prior art.

In addition, since details of the tunable laser source portion 1 are given like the description in FIG. 3 and are similar to those set forth in FIG. 4 in the prior art, their explanation will be omitted hereunder.

Figure 2:
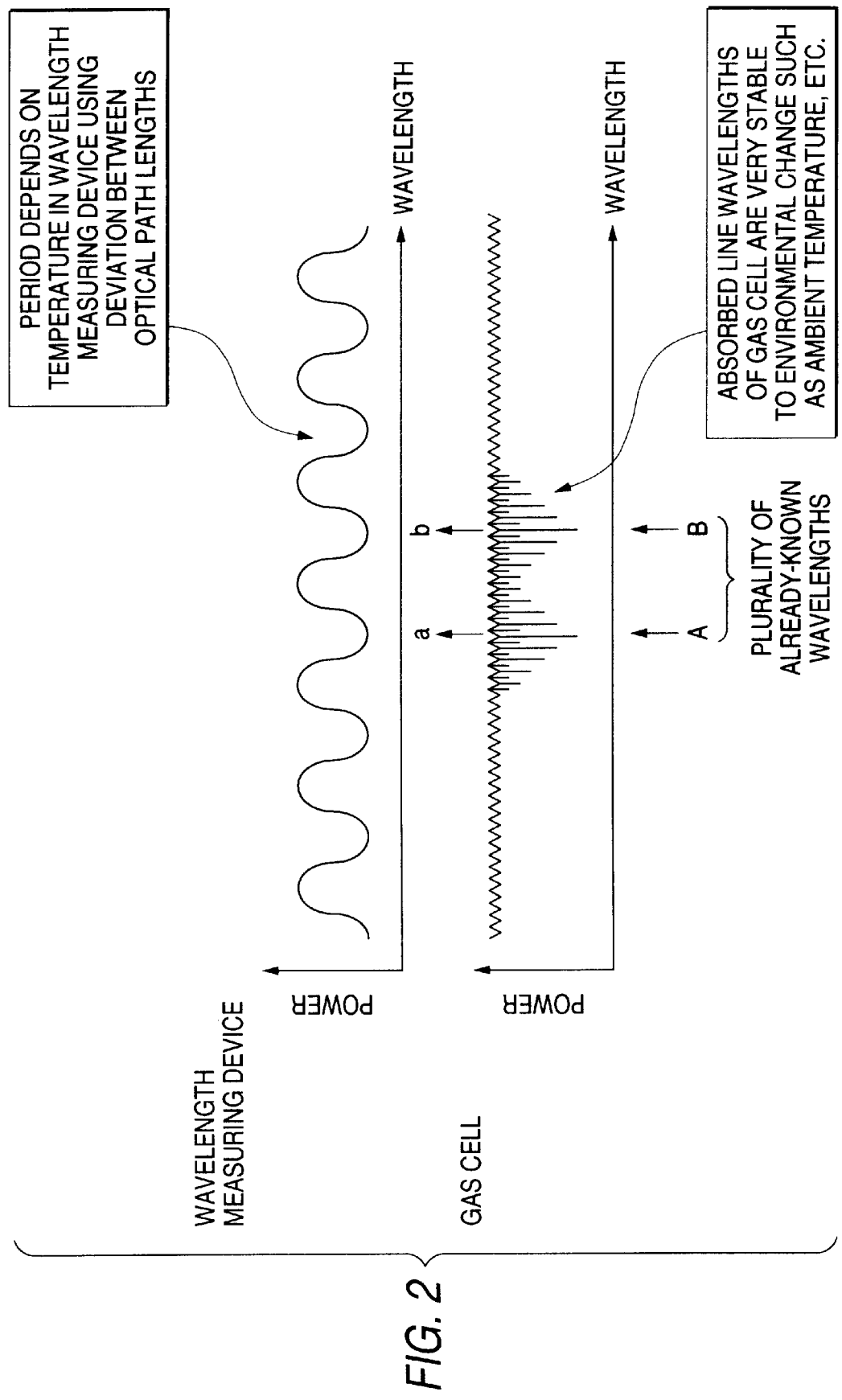
FIG. 2 is a view showing a relationship of outputs between a wavelength measuring device and a gas cell as a reference for callibrating wavelength of the present invention.

The feature of the tunable laser source device, which is set forth in FIG. 1 and to which the present invention is applied, in hardware is that a plurality of already-known absorbed line wavelengths indicated by arrows in FIG. 2 (two points in FIG. 2) exist in the gas cell as a reference for callibrating wavelength 5.

FIG. 2 is a view showing a relationship of outputs between the gas cell as a reference for callibrating wavelength (5 in FIG. 1) and the wavelength measuring device (6 in FIG. 1) that utilizes the periodical change of the interference power generated based on the deviation between the optical path lengths in the etalon, etc.

In FIG. 2, an abscissa denotes the wavelength and an ordinate denotes the power.

As shown in FIG. 2, the gas cell has the characteristic that absorbs a plurality of particular already-known wavelengths (two points in FIG. 2). The absorbed line wavelengths of the gas cell are very stable to the environmental change such as the ambient temperature, etc.

In contrast, as shown in FIG. 2, the measured output of the wavelength measuring device that utilizes the deviation between the optical path lengths is changed such that its power has the peak and the notch periodically.

In this case, the interval between the peak (notch) and the peak (notch) has the characteristic that depends on the change in the ambient temperature.

In other words, although the already-known absorbed line wavelength of the gas cell can correspond to two notches of the measured output of the wavelength measuring device that utilizes the deviation between the optical path lengths at a certain ambient temperature like FIG. 2, the measured output of the wavelength measuring device that utilizes the deviation between the optical path lengths in FIG. 2 is expanded and contracted in the lateral axis direction if the ambient temperature is changed. Thus, the absorbed line wavelength does not coincide with two notches of the measured output.

In the present invention, the peak and the notch of the periodical power change of the measured output of the wavelength measuring device are included between the particular plural (two points in FIG. 2) already-known absorbed line wavelengths A and B of the gas cell so as to exceed the predetermined number.

More particularly, at least one peak and one notch or two peaks or two notches or more are included in the period ab that corresponds to the period between the plural (two points in FIG. 2) already-known wavelengths, i.e., the absorbed line wavelengths A and B of the gas cell. (In FIG. 2, two notches and one peak are included between ab.)

In this manner, since one peak and one notch or two peaks or two notches or more are present between at least two already-known wavelengths (between A and B in FIG. 2), the measured wavelength can be calculated other than two already-known points (on the outside) in terms of conversion based on the periodicity of the wavelength measuring device.

In the invention set forth in Aspect 1, there is provided a tunable laser source device for branching a light output from a tunable laser source portion 1 to supply to a wavelength measuring device 6 and a wavelength calibrating reference device 5 and then controlling the tunable laser source portion in response to an output of the wavelength measuring device, wherein at least one peak and one notch or two peaks or two notches or more in a measurement interference period of the wavelength measuring device are included between a plurality of reference wavelengths of the wavelength calibrating reference device. Therefore, since at least two points, i.e., one peak and one notch in the measurement interference period of the wavelength measuring device can be calibrated by the wavelength calibrating reference device, the precise wavelength measurement can be achieved even if the external environment is changed.

Further, in the inventions set forth in Aspects 2 to 4, the wavelength calibrating reference device is formed of the gas cell, and also the wavelength measuring device includes the wavelength measuring device such as the etalon that measures the wavelength by utilizing the periodical change of the interference power based on the deviation between optical path lengths. Therefore, if the temperature of the wavelength measuring device is controlled such that the wavelength interval measurement coincides with the measured result by the wavelength measuring device at two already-known wavelengths or more based on the absorbed line wavelengths of the gas cell, the extremely high wavelength linearity can be obtained at the wavelength of the gas cell on the outside of the absorbed line wavelengths.

Further, in the invention set forth in Aspect 5, since the tunable laser source portion is constructed such that it can sweep continuously a wavelength thereof, the effect of improving the wavelength accuracy in the continuous wavelength sweep can be increased.

Further, the tunable laser source devices that are capable of sweeping the wavelength continuously with high accuracy can contribute the event that the accuracy in the measurement of the wavelength dependency characteristic of optical parts employed in the optical communication, etc. is increased considerably.

What is claimed is:

1. A tunable laser source device comprising:
   a wavelength measuring device,
   a tunable laser source portion,
   a wavelength calibrating reference device,
   said tunable laser source device for branching a light output from said tunable laser source portion to supply to said wavelength measuring device and said wavelength calibrating reference device, and controlling said tunable laser source portion in response to an output of said wavelength measuring device, wherein
   at least one peak and one notch, two peaks, or two notches or more in a measurement interference period of said wavelength measuring device are included between a plurality of reference wavelengths of said wavelength calibrating reference device.

2. The tunable laser source device according to claim 1, wherein
   said wavelength calibrating reference device is formed of a gas cell.

3. The tunable laser source device according to claim 1, wherein
   said wavelength measuring device measures a wavelength by utilizing a periodical change of an interference power based on a deviation between optical path lengths.

4. The tunable laser source device according to claim 3, wherein
   said wavelength measuring device is formed of an etalon.

5. The tunable laser source device according to claim 1, wherein
   said tunable laser source portion is capable to sweep continuously a wavelength thereof.

* * * * *